United States Patent [19]

Williamson

[11] Patent Number: 5,087,478
[45] Date of Patent: Feb. 11, 1992

[54] DEPOSITION METHOD AND APPARATUS USING PLASMA DISCHARGE

[75] Inventor: Weldon S. Williamson, Malibu, Calif.

[73] Assignee: Hughes Aircraft Company, Los Angeles, Calif.

[21] Appl. No.: 388,229

[22] Filed: Aug. 1, 1989

[51] Int. Cl.$^5$ .................... B05D 3/06; C23C 16/00
[52] U.S. Cl. ..................... 127/39; 118/50.1; 118/720; 118/723; 204/192.32; 204/298.31
[58] Field of Search ............... 427/38, 39, 45.1, 47, 427/49, 50; 118/50.1, 722, 723, 724, 720, 725; 204/192.32, 192.35, 192.31, 298.02, 298.05, 298.06, 298.31

[56] References Cited

U.S. PATENT DOCUMENTS

| | | | |
|---|---|---|---|
| 3,840,451 | 10/1974 | Golyanov et al. | 204/192.15 |
| 3,925,187 | 12/1975 | Bernard | 427/38 X |
| 3,961,103 | 6/1976 | Aisenberg | 204/298 BD |
| 4,109,061 | 8/1978 | Beale et al. | 427/39 X |
| 4,170,662 | 10/1979 | Weiss et al. | 427/38 |
| 4,310,614 | 1/1982 | Connell et al. | 118/723 X |
| 4,410,758 | 10/1983 | Grolitzer | 427/39 X |
| 4,725,345 | 2/1988 | Sakamoto et al. | 427/39 X |

OTHER PUBLICATIONS

Banks, Bruce A. and Rutledge, Sharon, "Ion Beam Sputter-Deposited Diamondlike Films", J. Vac. Sci. Technol., 21(3), Sep./Oct. 1982, pp. 807-814.
Kawarada, Hiroshi, et al., "Large Area Chemical Vapour Deposition of Diamond Particles and Films Using Magneto-Microwave Plasma", Japanese Journal of Applied Physics, vol. 26, No. 6, Jun. 1987, pp. L1032-L1034.
Matusmoto, Seiichiro, "Synthesis of Diamond Films in a rf Induction Thermal Plasma", Appl. Phys. Lett. 51(10), Sep. 7, 1987, pp. 737-739.
Freeman, J. H., et al., "The Epitaxial Synthesis of Diamond by the Deposition of Low Energy Carbon Ions", Vacuum/vol. 34/Nos. 1-2, pp. 305-314/1984.

*Primary Examiner*—Nam X. Nguyen
*Attorney, Agent, or Firm*—V. D. Duraiswamy; W. K. Denson-Low

[57] ABSTRACT

A Penning type plasma discharge is formed in an inert gas between a cathode and anode. A carbon source such as graphite is heated to vaporization temperature, and vaporized carbon atoms caused to flow therefrom into the plasma where they are ionized. The inert gas supply is then removed, and the plasma discharge is sustained by the carbon vapor. A substrate is mounted adjacent to, and at the same electrical potential as, the cathode. With the potential of the plasma being maintained at approximately 70 to 100V relative to the substrate, carbon ions are attracted to and deposited on the substrate to form a diamond layer. The initial inert gas plasma discharge may be used to sputter-clean the surface of the substrate prior to diamond deposition. A dopant or other additive material may be injected into the carbon plasma, thereby enabling the fabrication of microelectric or other devices in the diamond layer. A material other than carbon may be vaporized for deposition using the same process as for diamond deposition. In addition, the process may be modified to provide a plasma source of pure ions, which may be extracted and utilized for a purpose other than deposition of a material layer.

26 Claims, 1 Drawing Sheet

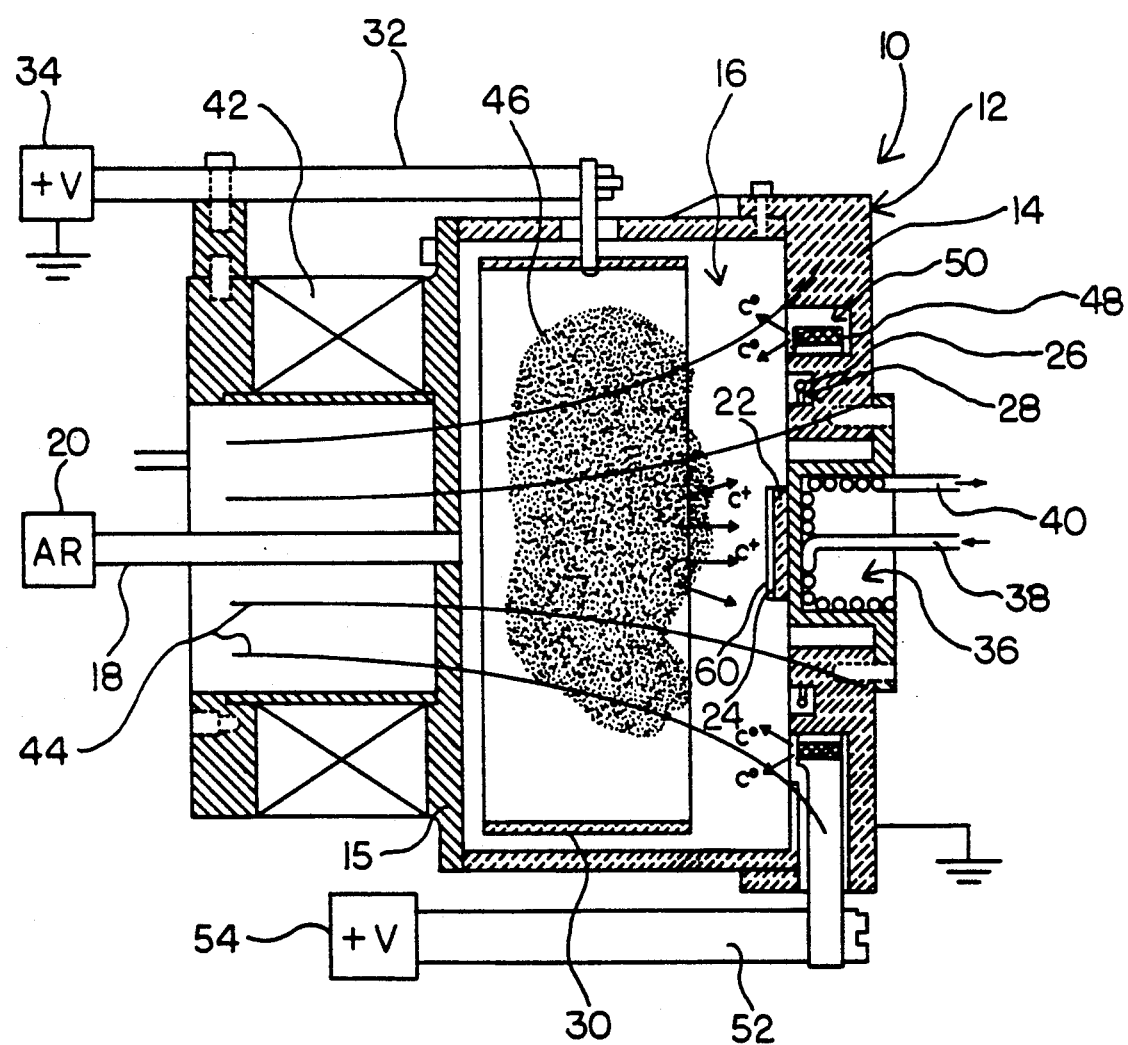

DEPOSITION METHOD AND APPARATUS USING PLASMA DISCHARGE

BACKGROUND OF THE INVENTION

1. Field of the Invention

The present invention relates to deposition of a diamond layer on a substrate by means of a Penning-type plasma discharge.

2. Description of the Related Art

Electronic properties of diamond layers or films, coupled with their high thermal conductivity, make the films extremely attractive for semiconductors. High-power transistors that require no external heat sinks are one possibility for single-crystal films. High-density integrated circuits could be packed close enough to shorten electron paths and speed up the circuits. Diamond's resistance to radiation makes these ICs attractive for use in varied applications. Diamond is superior even to gallium arsenide in virtually all electrical properties, and can be operated at elevated temperatures on the order of 700° C.

Diamond film layers may find beneficial applications in a number of other areas, including infrared transparent windows for sensors, dome coatings for abrasion resistance, heat sinking (carbon has five times the thermal conductance of copper) for microelectronics and other applications, and hard coatings for tools, high-wear parts, and similar tribological applications.

Diamond has been deposited by a wide number of processes, such as beam-assisted chemical vapor deposition (CVD) and carbon-ion impact from a carbon ion beam.

A CVD process starts by introducing a mixture of hydrogen and a hydrocarbon gas, usually methane, into a low 5 pressure chamber. The mixture is heated to about 2000° C. using an electric filament, microwave, or other heat source. At this temperature, the hydrogen and methane dissociate into hydrogen and carbon atoms. The carbon atoms are deposited on the substrate, which is heated to 600° to 1000° C.

The hydrogen enhances the formation of the diamond film using CVD by inhibiting graphitization. In a diamond, each carbon atom has four bonds to other carbon atoms. If not enough carbon atoms are present to form four bonds, atoms will form two bonds, creating a graphite-type surface. Hydrogen atoms hook up with unattached bonds of carbon atoms and stabilize them until other carbon atoms come along to take their place. Each incoming carbon atom forms a single bond with each of four neighbors, resulting in the diamond structure. Most of the hydrogen atoms are released.

Representative examples of beam-assisted CVD processes are found in "Ion beam sputter-deposited diamondlike films", by B. A. Banks et al, J. Vac. Sci. Technol., 21(3), Sept./Oct. 1982, pp. 807-814; "Large Area Chemical Vapour Deposition of Diamond Particles and Films Using Magneto-Microwave Plasma", by H. Kawarada et al, Japanese Journal of Applied Physics, Vol. 26, no. 6, June 1987, pp. L1032-L1034; and "Synthesis of diamond films in a rf induction thermal plasma", by S. Matsumoto et al, Appl. Phys. Lett. 51(10), Sep. 7, 1987, pp. 737-739.

The carbon-ion-beam method is the closest known prior art, in that pure carbon is used, but the carbon ion beams typically have either inappropriately high energies, or are very low in current density or fluence due to space-charge limitations in the beam forming optics. The high energies cause dislocations, twinning, and other defects. Low fluences result in exceedingly slow growth rates. In both cases, the substrate must be heated, with multiple attendant problems. A treatise on this method of diamond film deposition is found in "The epitaxial synthesis of diamond by the deposition of low energy carbon ions", by J. H. Freeman et al, Vacuum/volume 34/numbers 1-2/pages 305-314/1984 (Great Britain). All of these processes require the substrate to be heated to temperatures around 600° C. When the substrate cools, differential expansion places the diamond film in stress, limiting the thickness and quality of the films. Few processes produce single crystals of more than a few micrometers in size, with polycrystalline or amorphous materials being most commonly produced.

SUMMARY OF THE INVENTION

The present invention utilizes a Penning-type plasma discharge operating on pure carbon or a carbon material and selected buffer gasses or dopants. The system deposits diamond onto a substrate that is unheated and can be near room temperature. The novelty of this approach is its use of a pure-carbon plasma (rather than one derived from a carbonaceous gas), to produce higher fluxes of carbon ions at the substrate surface than ion-beam methods, and its unique ability to deposit on low-temperature substrates. The present process enables the formation of films or layers of single-crystal diamond, which can be doped during deposition, enabling a new generation of diamond-based microelectronics to develop.

In accordance with the present invention, a Penning-type plasma discharge is formed in an inert gas such as argon between a cathode and anode. A magnetic field may be applied to contain the plasma. A carbon source such as graphite is heated to vaporization temperature, and vaporized carbon atoms caused to flow therefrom into the plasma where they are ionized. The inert gas supply is then removed, and the plasma discharge is sustained by the carbon vapor. A substrate is mounted adjacent to, and at the same electrical potential as, the cathode. With the potential of the plasma being maintained at approximately 70 to 100 V relative to the substrate, carbon ions are attracted to and deposited on the substrate to form a diamond layer. The initial argon plasma discharge may be used to sputter-clean the surface of the substrate prior to diamond deposition. A dopant or other additive material may be injected into the carbon plasma, thereby enabling the fabrication of microelectronic or other devices in the diamond layer.

The present invention provides a method or process for performing deposition of a diamond layer or film, as well as an apparatus for performing the method. The advantages of the present invention over previously known diamond deposition processes further include the ability to perform the process at room temperature, and to arbitrarily adjust the composition of the plasma. In addition, the carbon-ion fluence can be made high for rapid deposition and low impurity content. The present process is capable of forming a diamond layer on shapes other than flat, because the plasma sheath will conform to the shape of the substrate and cause ion deposition from all angles.

A material other than carbon may be vaporized for deposition using the same process as for diamond deposition. Examples of such materials include cubic boron nitride (by deposition of nitrogen and boron ions), and deposition of a metal such as tungsten.

The plasma discharge of carbon vapor produces a pure source of carbon or other ions which may be extracted, within the scope of the present invention, and utilized for purposes other than deposition of diamond on a substrate. A preferred application of such an ion source would be in an apparatus for plasma ion implantation.

These and other features and advantages of the present invention will be apparent to those skilled in the art from the following detailed description, taken together with the accompanying drawing.

DESCRIPTION OF THE DRAWINGS

The single Figure of drawing is a vertical sectional view illustrating an apparatus for practicing a plasma discharge, diamond deposition method embodying the present invention.

DETAILED DESCRIPTION OF THE INVENTION

As illustrated in the drawing, an apparatus 10 for practicing the present invention includes a housing or enclosure 12, having a face plate 14 made of an electrically conductive material. The face plate 14 may typically be made of a metal such as aluminum, or graphite, which is a refractory material. An extension 15, which may be made of an electrically conductive or non-conductive material, is fixed to the face plate 14 to form a sealed space 16 therein. An inlet conduit 18 is provided for supplying an inert gas, which is preferably argon, into the space 16 from a source 20.

A substrate 22, having a surface 24 on which a diamond film or layer is to be deposited, is fixedly mounted at a central position on the inner surface of the face plate 14 in electrical contact therewith. A filament cathode 26, made of a material selected for efficient emission of electrons, such as tantalum or tungsten wire, is mounted in an annular groove 28 in the face plate 14. The cathode 26 has an annular shape, coaxially surrounding the substrate 22, and is electrically connected to the face plate 14.

An anode 30, having a generally tubular shape, is mounted in the housing 12 in spaced axial relation from the cathode 26. The anode 30 is suspended in the space 16 by means of an electrically conductive support 32, which also functions to connect the anode 30 to a voltage source 34. Where the face plate 14 and thereby the cathode 26 and substrate 22 are grounded, the source 34 is designed to apply an electric potential to the anode 30 which is positive relative to ground. The anode 30 may be made of metal, graphite, or other suitable electrically conductive material.

The portion of the face plate 14 on which the substrate 22 is mounted is cooled by means of water circulated through a chamber 36 provided with an inlet conduit 38 and outlet conduit 40. Further illustrated is an annular electromagnetic coil 42 which is suitably supplied with electric current to generate magnetic field lines depicted by arrows 44.

In operation, argon gas is supplied into the space 16 between the cathode 26 and anode 30. A positive electric potential is applied from the source 34 to the anode 30, creating a glow or Penning plasma discharge of the argon gas as illustrated at 46. The potential applied by the source 34 may have a relatively large value for initiating the plasma discharge, and be reduced to a lower value for sustaining the discharge.

In accordance with an important feature of the present invention, a carbon vapor source is provided which includes a carbon material 48, preferably graphite, in annular form. The material 48 is mounted in an annular groove 50 in the face plate 14, coaxially with the cathode 26, by means of an electrically conductive support member 52, which also functions to supply a large value of electric current through the material 48 from a source 54. The value of electric current is sufficient to heat the carbon material 48 to its vaporization point, at which it emits carbon atoms C° which diffuse away from the material 48 into the plasma 46.

Heating of the carbon material 48 creates an increasing concentration of carbon atoms in the plasma 46. The supply of argon gas into the plasma 46 from the source 20 may be progressively decreased as the carbon vapor concentration increases until a point is reached at which the carbon content in the plasma 46 is sufficient to sustain the plasma discharge without the presence of supplemental argon. At this point the argon supply may be shut off completely. Containment of the plasma 46 in the space within the anode 30 is facilitated by the magnetic field 44 created by the electromagnetic coil 42.

The carbon atoms $C^+$ which are caused to flow into the plasma 46 are ionized therein. Electrons generated through ionization are attracted toward the anode 30, whereas positive carbon ions $C^+$ are attracted toward the lower potential surfaces constituted by the cathode 26, substrate 22, and adjacent portions of the face plate 14. The positive carbon ions C. which impinge on the surface 24 of the substrate 22 form a high quality diamond film or layer 60 thereon. The voltage applied to the anode 30 is selected such that the positive potential of the plasma 46 relative to the substrate 22 is on the order of 70 to 100 V, the optimal value for deposition of a diamond film. Generally, the voltage applied to the anode 30 from the source 34 will be approximately equal to the potential of the plasma 46.

The carbon vaporizer shown in the drawing is a hoopshaped piece of graphite which is heated to the vaporization point by the passage of large DC currents via the water-cooled vaporizer mounts. The carbon vapor that is released has no line-of-sight view of the substrate, mounted centrally on a water-cooled holder. Carbon atoms leaving the vaporizer are ionized with high probability in passing through the plasma discharge. They are then accelerated back by the biasing force created by the anode-cathode potential difference, striking the substrate (as well as the other cathode-potential surfaces). As the vaporizer temperature is increased, the argon flow can be reduced, and gases other than argon can be introduced, to vary the deposition parameters or to introduce dopants or other additives into the discharge plasma.

Although the plasma discharge may be initiated using vaporized carbon without the introduction of supplemental argon or other inert gas, the initial argon discharge is advantageous in that it cleans the interior surfaces of the housing 12, and especially the surface 24 of the substrate 22 by sputter-cleaning. At any desired point in the deposition process, the argon supply may be terminated, and/or supplemented by injection of one or more additional gaseous materials. Although not illustrated in the drawing, the source 20 may be adapted to supply more than one gas into the space 16, and include a valve arrangement for metering the relative proportions thereof.

The best results will be produced where the diamond film is grown on a substrate material having a closely matched lattice constant. Diamond, and diamond-like carbon, are the most obvious choices. However, the invention is not so limited, and other substrate materials such as silicon, and single-crystal copper, may be used.

Additives which may be advantageously introduced into the plasma discharge for deposition in the diamond lattice structure include semiconductor dopants such as phosphorus, arsenic, and antimony (donors), and boron (acceptor). The dopant deposition may be performed on selected areas of the substrate 22 using various masking techniques or the like to form microelectronic devices in the diamond layer 60. Other additives include buffer gases such as hydrogen for controlling or enhancing the deposition process.

The present process enables carbon ions with the optimal energy (70 to 100 V) to reach the substrate in high fluences without any space-charge limitation as in the prior art, with the ion flux limited only by the plasma density and ion-arrival rate at the substrate. This enables the deposition of high quality, crystalline diamond films at substrate temperatures of 50° C. or lower.

Although a preferred material for deposition by the present process is diamond (by deposition of carbon ions), the scope of the invention is not so limited. The present process may be utilized to deposit layers of a wide variety of materials on a substrate, for example cubic boron nitride (by deposition of nitrogen and boron), and metal films such as tungsten.

The process and apparatus of the invention produce pure carbon ions which may be extracted by an electric field or other means and utilized for applications other than forming a diamond layer on a substrate.

While an illustrative embodiment of the invention has been shown and described, numerous variations and alternate embodiments will occur to those skilled in the art, without departing from the spirit and scope of the invention. Accordingly, it is intended that the present invention not be limited solely to the specifically described illustrative embodiment. Various modifications are contemplated and can be made without departing from the spirit and scope of the invention as defined by the appended claims.

I claim:

1. A method of forming a layer on a substrate, comprising the steps of:
    (a) creating a Penning-type gas discharge plasma between an annularly shaped filament cathode and a tubular anode in spaced axial relation from said cathode such that a plasma sheath conforming to the shape of said substrate is created by applying an electric potential to the anode at a value selected to cause the plasma to be at a positive potential relative to the substrate;
    (b) vaporizing a source material mounted coaxially with said cathode and causing a vapor of atoms of the source material to diffuse into the plasma for ionization; and
    (c) applying an electric potential to said substrate to cause ions of the source material to flow from the plasma onto the substrate to form a layer thereon.

2. A method as in claim 1, in which the source material is a carbon material, step (b) comprising heating the carbon material to a vaporization temperature thereof, the layer deposited in step (c) being a diamond layer.

3. A method as in claim 1 in which the source material comprises graphite, step (b) comprising heating the graphite to a vaporization temperature thereof, the layer deposited in step (c) being a diamond layer.

4. A method as in claim 1 in which steps (a) and (c) comprise applying the same electric potential to the cathode and substrate.

5. A method as in claim 1 in which steps (a) and (c) further comprise maintaining the substrate in close proximity to the cathode.

6. A method as in claim 1, in which:
    step (b) further comprises causing a vapor of atoms of an additive material to flow into the plasma for ionization; and
    step (c) further comprises causing ions of the additive material to flow from the plasma onto the substrate.

7. A method as in claim 1, in which steps (a) and (b) comprise the substeps of:
    (d) providing an inert ionizable gas;
    (e) creating a gas discharge plasma of the inert gas; and
    (f) progressively removing the inert gas while causing a vapor of atoms of the source material to flow into the plasma to sustain the discharge.

8. A method as in claim 7, in which step (e) further comprises causing ions of the inert gas to flow from the plasma onto the substrate to clean the surface of the substrate by sputtering.

9. A method as in claim 7, in which step (d) comprises providing argon gas, step (e) further comprising causing argon ions to flow from the plasma onto the substrate to clean the surface of the substrate by sputtering.

10. A method as in claim 1, in which steps (a), (b), and (c) comprise maintaining the substrate at a temperature of approximately 50° C. or below.

11. An apparatus for forming a layer of a source material on a substrate, comprising:
    cathode and anode for producing an electric field therebetween, said cathode having an annular shape so that the substrate can be positioned inside the annulus in electrical connection with said cathode;
    gas source means for supplying an ionizable gas between the cathode and anode, the electric field creating a gas discharge plasma of the ionizable gas;
    means for creating a magnetic field for containing the plasma between the anode and the cathode;
    vapor source means extending around the cathode for causing a vapor of atoms of the source material to flow into the plasma for ionization; and
    biasing means for causing ions of the source material to flow from the plasma onto the substrate.

12. An apparatus as in claim 11, in which the biasing means comprises bias source means for applying an electric potential to the substrate which attracts the ions of the source material from the plasma.

13. An appararus as in claim 11, in which the vapor source means comprises heater means for heating a carbon material to a vaporization temperature thereof.

14. An apparatus as in claim 11, in which the vapor source means comprises heater means for heating graphite to a vaporization temperature thereof.

15. An apparatus as in claim 11, in which the vapor source means comprises means of vaporizing a carbon material and causing the vaporized carbon atoms to diffuse from the material into the plasma.

16. An apparatus as in claim 11 including means for creating the electric field by applying an electric potential to the anode which is positive relative to the cathode;

the biasing means comprising means for applying an electric potential to the substrate which is negative relative to the anode.

17. An apparatus as in claim 11, further comprising means for maintaining the substrate at a same electric potential as the cathode.

18. An apparatus as in claim 11, further comprising means for maintaining the substrate in close proximity to the cathode.

19. An apparatus as in claim 11, further comprising means for applying electric potentials to the cathode, anode, and substrate selected to cause the plasma to be at a potential of substantially 70 to 100 volts positive relative to the substrate.

20. An apparatus as in claim 11, further comprising means for causing a vapor of atoms of an additive material to flow into the plasma for ionization;

the biasing means further causing ions of the additive material to flow from the plasma onto the substrate.

21. An apparatus as in claim 11, in which the gas source means supplies an inert ionizable gas for ionization by the cathode means and anode means;

the apparatus further comprising means for progressively removing the inert gas while causing the vapor of atoms of the source material to flow into the plasma to sustain the discharge.

22. An apparatus as in claim 21, further comprising means for causing ions of the inert gas to flow from the plasma onto the substrate to clean the surface of the substrate by sputtering.

23. An apparatus as in claim 22, in which the inert gas is argon.

24. An apparatus as in claim 11, further comprising means for maintaining the substrate out of line-of-sight view of the vapor source means.

25. A method of forming a layer on a substrate, comprising the steps of:

(a) creating a gas discharge plasma in a space between an annularly shaped filament cathode and a tubular shaped anode in spaced axial relation;

(b) causing a vapor of atoms of a source material in annular form and mounted coaxially with said cathode, to flow into the plasma for ionization;

(c) applying a magnetic field generated by an annular electromagnetic coil axially mounted with respect to said anode to contain the plasma within said tubular anode;

(d) mounting said substrate on a water-cooled holder at a central position within said filament cathode and out of line-of-sight view of said source material;

(e) applying an electrical potential to the substrate to cause the ions of the source material to flow from the plasma onto the substrate to form a film thereon; and (f) before step (b), introducing an inert ionizable gas into the space between said cathode and said anode to sputter clean the surface of said substrate.

26. An apparatus for forming a layer of source material on a substrate, comprising:

an enclosure including:

a face plate made of an electrically conductive material and having first and second annular grooves;

an extension fixed to said face place to form a sealed space within said enclosure, and an inlet conduit for supplying gas into said enclosure;

a filament cathode mounted in said first annular groove in said face plate, said cathode having an annular shape and coaxially surrounding said substrate and being in electrical contact with said face plate;

an anode suspended inside said enclosure in spaced axial relation from said cathode, said substrate being mounted on an inner surface of said face plate in electrical contact therewith;

source material in annular form mounted in said second annular groove in said face plate coaxially with said cathode;

an electrically conductive support member for mounting said source material in said face plte and to supply current to said material for heating said material, and means for creating a magnetic field for plasma containment.

* * * * *

UNITED STATES PATENT AND TRADEMARK OFFICE
CERTIFICATE OF CORRECTION

PATENT NO. : 5,087,478
DATED : February 11, 1992
INVENTOR(S) : WELDON S. WILLIAMSON It is certified that error appears in the above-identified patent and that said Letters Patent is hereby corrected as shown below:

Col. 6, line 61, delete "appararus" and insert --apparatus--.

Col. 6, line 68, delete "of" and insert --for--.

Col. 8, line 42, delete "plte" and insert --plate--.

Signed and Sealed this

Twenty-sixth Day of October, 1993

Attest:

BRUCE LEHMAN

*Attesting Officer*  *Commissioner of Patents and Trademarks*